US012562716B2

(12) United States Patent
Habel et al.

(10) Patent No.: US 12,562,716 B2
(45) Date of Patent: *Feb. 24, 2026

(54) SINGLE SUBSTRATE MULTIPLEXER

(71) Applicant: RF360 Singapore Pte. Ltd., Singapore (SG)

(72) Inventors: Florian Habel, Munich (DE); Thomas Bauer, Munich (DE); Peter Hagn, Finsing (DE); Thomas Dengler, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/784,219

(22) Filed: Jul. 25, 2024

(65) Prior Publication Data

US 2025/0062750 A1      Feb. 20, 2025

Related U.S. Application Data

(63) Continuation of application No. 17/597,465, filed as application No. PCT/EP2020/069415 on Jul. 9, 2020, now Pat. No. 12,074,587.

(30) Foreign Application Priority Data

Jul. 16, 2019     (DE) ..................... 10 2019 119 239.0

(51) Int. Cl.
| | |
|---|---|
| *H03H 9/72* | (2006.01) |
| *H03H 9/02* | (2006.01) |
| *H03H 9/05* | (2006.01) |
| *H03H 9/25* | (2006.01) |
| *H03H 9/56* | (2006.01) |

(52) U.S. Cl.
CPC ........ *H03H 9/725* (2013.01); *H03H 9/02559* (2013.01); *H03H 9/058* (2013.01); *H03H 9/25* (2013.01); *H03H 9/568* (2013.01); *H03H 9/02834* (2013.01)

(58) Field of Classification Search
None
See application file for complete search history.

(56) References Cited

U.S. PATENT DOCUMENTS

| | | | |
|---|---|---|---|
| 7,084,718 B2 | 8/2006 | Nakamura et al. | |
| 8,410,865 B2 | 4/2013 | Jibu et al. | |
| 9,160,306 B2 | 10/2015 | Link et al. | |
| 10,263,601 B2 * | 4/2019 | Bradley ................. | H03H 9/605 |
| 10,819,312 B2 | 10/2020 | Nosaka | |
| 11,323,098 B2 | 5/2022 | Takata | |
| 11,621,687 B2 | 4/2023 | Daimon et al. | |

(Continued)

FOREIGN PATENT DOCUMENTS

| | | |
|---|---|---|
| CN | 106664072 A | 5/2017 |
| DE | 112014005424 T5 | 8/2016 |

OTHER PUBLICATIONS

International Search Report and Written Opinion—PCT/EP2020/069415—ISA/EPO—Oct. 5, 2020.

*Primary Examiner* — Kenneth B Wells
(74) *Attorney, Agent, or Firm* — Polsinelli

(57) ABSTRACT

At least three acoustic filters circuits FC are arranged on a single chip CH. At least two of them are electrically connected already on the chip for multiplexing. This reduces space consumption and leads to smaller device size.

17 Claims, 3 Drawing Sheets

(56)  References Cited

U.S. PATENT DOCUMENTS

| | | | |
|---|---|---|---|
| 11,863,158 | B2 | 1/2024 | Ota et al. |
| 12,074,587 | B2 | 8/2024 | Habel et al. |
| 2004/0155730 | A1 | 8/2004 | Iwamoto et al. |
| 2006/0022768 | A1 | 2/2006 | Yokota et al. |
| 2010/0134203 | A1 | 6/2010 | Inoue et al. |
| 2011/0266917 | A1 | 11/2011 | Metzger et al. |
| 2013/0285768 | A1 | 10/2013 | Watanabe et al. |
| 2014/0113571 | A1 | 4/2014 | Fujiwara et al. |
| 2017/0063332 | A1 | 3/2017 | Gilbert et al. |
| 2017/0288627 | A1 | 10/2017 | Takano et al. |
| 2017/0302251 | A1 | 10/2017 | Ruby et al. |
| 2018/0123562 | A1 | 5/2018 | Bradley |
| 2018/0131349 | A1 | 5/2018 | Takata |
| 2018/0159498 | A1 | 6/2018 | Castex et al. |
| 2018/0159507 | A1 | 6/2018 | Goto et al. |
| 2018/0358951 | A1 | 12/2018 | Ohkubo et al. |
| 2019/0058452 | A1 | 2/2019 | Takata |

* cited by examiner

SINGLE SUBSTRATE MULTIPLEXER

CROSS-REFERENCE TO RELATED APPLICATION(S)

This application claims priority to and is a Continuation of U.S. patent application Ser. No. 17/597,465, titled "SINGLE SUBSTRATE MULTIPLEXER" filed Jan. 6, 2022 and now issued as U.S. Pat. No. 12,074,587, which is a national stage application under 35 U.S.C. 371 of PCT/EP2020/069415, entitled "SINGLE SUBSTRATE MULTIPLEXER" filed Jul. 9, 2020, which claims benefit of Foreign application Ser. No. 10/201,9119239.0 entitled "SINGLE SUBSTRATE MULTIPLEXER" filed Jul. 16, 2019, the disclosure of which is hereby incorporated by reference in its entirety herein.

BACKGROUND

At least 3 acoustic filters are arranged on a single chip. At least two of them are electrically connected already on the chip for multiplexing. This reduces space consumption and leads to smaller device size.

In current mobile communication devices multiplexers are used to allow filter operation in a multitude of frequency bands while using the same antenna connected to the multiplexer.

Discrete electroacoustic components with more than two filter functions or multiplexers consist of a carrier board e.g. a laminate and individual filter chips. Respective filter functions are embodied on respective separate chips. This has the advantage that a separately optimized layer stack can be used for each filter function and different filter technologies can be used. In addition, the chip size used for individual filters remains small, which offers some advantages, e.g. in the mechanical stability or with regard to the failure of individual filters during production, or also when trimming the individual chips to the target frequency.

However the carrier board must be large enough to maintain minimum distances at the chip edges and between the electroacoustic chips. Moreover, heat dissipation is not optimal, and cutting small chips out of a wafer reduces the acoustically usable area and produces larger material losses when dicing the wafer.

Using larger chips with more than two filter functions combined on a single chip is more sensitive to cracks and failure during operation due to thermal mismatch in a package or between carrier board and chip. Further, the optimization of the different filter functions is difficult to meet at the same time on the same chip.

It is an object of the present invention to provide a multiplexer as a one chip solution that is thermally matched and that fully meets the specification for different filter functions. A further object is to provide a multiplexer with improved heat dissipation properties.

At least one of these objects is met by a multiplexer according to independent claim 1. Advantageous features and embodiments can be taken from the dependent claims.

A multiplexer is formed from a single monolithic stack comprising a carrier substrate comprising Si, a thin film piezoelectric layer above the substrate having a main surface, and at least one dielectric layer arranged between piezoelectric layer and substrate. On top of the main surface a structured metallization comprises an antenna terminal for connection with an antenna, three signal pads and three SAW filter circuits. The filter circuits are connected in parallel between the antenna terminal and a respective signal pad each. Each of the filter circuits comprises a series signal line and a number of SAW resonators connected in series with or parallel to the series signal line. A package provides a cavity on top of the stack, wherein the SAW resonators are enclosed therein. The cavity is formed between the main surface of the piezoelectric layer and a lid and/or a cover.

The multiplexer uses a single stack to realize all filter functions that are performed by the multiplexer. With a suitable band combination that is a suitable combination of filter functions for these bands, all bands can be operated with the same antenna with sufficient isolation between the band channels and hence, without any crosstalk.

The stack uses a thin film piezoelectric layer that produces no spurious modes in any of the filter circuits that are combined at the antenna terminal. Hence, the neighbor bands are not disturbed when the multiplexer operates in one band.

Each filter circuit comprises all resonators necessary for the filter function. The multiplexer comprises a separate filter circuit for each band that can be operated by the multiplexer. This offers various technical advantages:

Wafer material can be saved. Instead of individually dicing out each small chip from a wafer, only a single larger chip has to be sawn out. This considerably reduces the area losses on the wafers caused by dicing (e.g. by one third for three square single chips or by half for four square single chips).

Depending on the process, acoustic resonators must always maintain a minimum distance from the chip edges. The use of a single chip instead of several smaller chips leads to a reduction of the entire chip edge area, which cannot be used acoustically and has to remain free of any filter element. In addition, the acoustic resonators can be placed more freely, since they do not have to be aligned on a straight edge in the area between the individual filter functions, but can be positioned variably. For the design of the existing acoustic surface, this offers more degrees of freedom and thus a more effective use of space.

In addition, the one-chip variant offers the advantage that any thermal loss energy generated can be dissipated more effectively. The resulting heat is distributed over a larger chip, radiates better and can be dissipated by a larger number of bumps. This can have a positive effect on the performance compatibility and service life of the components.

As normally only one filter circuit of the multiplexer is in operation only the respective filter circuit may produce heat. The non-active other filter circuits and the respective areas occupied by them offers enough volume within the stack to dissipate the heat sufficiently well to avoid a too high temperature rise.

It is preferred to use a substrate material for the stack that has a heat conductivity that is at least ten times higher than the respective conductivity of the piezoelectric layer. Such a relation can be achieved with a mono-crystalline Si carrier substrate and a piezoelectric layer consisting of lithium tantalate LT or lithium niobate LN. Silicon is approximately forty times better in thermal conductivity than the usual SAW materials LiTaO3 and LiNbO3. The piezoelectric layer having poor thermal conductivity is relatively thin and produces an accordingly low thermal resistance and heat can pass the layer effectively. Hence most of the heat dissipation takes place in the well-conducting Si substrate material and is thus improved over SAW devices or filter chips realized on a commonly known thick piezoelectric substrate.

According to preferred embodiments the piezoelectric layer is a monocrystalline thin film layer of lithium tantalate or lithium niobate and has a thickness ranging from 400 to 2000 nm. Such a layer thickness is advantageous for TF SAW filter circuits operating in the low band, the mid band and in the high band domain. To minimize acoustic loss, and to enable wafer bonding, the piezoelectric layer preferably has a smooth upper and lower surface. In this context a smooth surface has to be is understood to have a roughness value $Rq \leq 0.5$ nm where Rq is the respective root mean squared value. The root mean square (RMS or rms) is defined as the square root of the mean square (the arithmetic mean of the squares of a set of deviations from a mean line). An exact definition of roughness parameters can be found at https://en.wikipedia.org/wiki/Surface_roughness.

The dielectric layer below the piezoelectric layer is preferably a silicon oxide layer having a thickness of 300 nm to 2000 nm and a smooth top surface with a roughness value.

$Ra \leq 0.5$ µm where Ra is an arithmetical mean deviation from a constant means line of the assessed profile. Such a dielectric layer can function to reduce the TCF (thermal coefficient of frequency) of the multiplexer and compensates or reduces the temperature drift of the filter circuits that is due to the relatively high TCF of the piezoelectric.

Between a direct junction of the Si substrate and a silicon oxide layer, fixed positive charges appear, which attract mobile electrons, leading to a conductive layer subject to ohmic losses. To avoid such losses, it is advantageous to insert a trap-rich layer between Si and $SiO2$ layers. The trap-rich layer may consist e.g. of polycrystalline silicon with a thickness in the range of 100 nm to 2000 nm.

It is possible to use a multilayer board having contact pads on a bottom surface thereof and an integrated wiring within its multilayer structure for wiring and for packaging. The contact pads of the board are connected with respective external contacts on the top surface opposite to the bottom surface to allow connecting with external circuitry of an electric device like a mobile phone for example.

The multilayer board is mounted and electrically connected to the stack by a connection technique. Thereby the contact pads are connected with respective signal pads and the antenna terminal on the main surface, e.g. by bumps. A sealing means may be provided to seal the cavity formed between the multilayer board and the main surface.

Alternatively the SAW resonators may be enclosed in respective cavities integrally formed as a thin film acoustic package, TFAP. Such a TFAP may enclose a single filter function, part of a filter function or single resonators. A TFAP may be produced by applying and structuring a sacrificial material to preform respective cavities. Then a mechanically stable thin film is deposited over the entire surface of the chip to cover the sacrificial structures. The cavity is then released by removing the sacrificial material.

If a package technology with a board (e.g. CSSP) is used, the surface area of the board can be reduced, since the distances between the individual filter chips required for multichip multiplexers are eliminated by the single chip multiplexer. Since the size of the single chip used for the single chip variant is significantly larger than the size of a single chip of the multichip variant, it is advantageous in terms of the invention to use a board material that has a coefficient of thermal expansion similar to that of the wafer material. This minimizes mechanical stress during temperature cycles.

Suitable board materials are e.g. laminate, HTCC, or LTCC. The latter is especially advantageous in connection with silicon-based TF-SAW wafer material, allowing good adjustment of the thermal expansion coefficients of stack/ wafer and board to be achieved. Overall, competitive advantages result from lower costs and the smaller size of the multiplexer.

The full multiplexer interconnection can be measured at a very early stage of the manufacturing process and thus interactions between the individual filters can be detected. It is thus possible to compensate for production variations at an early state by trimming for example.

During manufacture of a single-chip multiplexer process, fluctuations usually have a similar effect on all filters of the stack, and can be corrected with a trimming process. This is contrary to the situation with multichip assemblies where substantial statistical deviations of device properties and a broad distribution of the filter functions can occur. If two of the filter functions are close to each other in frequency, and hence, require high mutual selection of the respective counter bands, they benefit from the single-chip setup of the new multiplexer, since both filter functions are subject to process variations running in parallel, i.e. critical pass band edges of different filter circuits on the same stack are shifted frequency wise in the same direction.

Thereby critical duplex spacing can be more easily guaranteed in process engineering. This is not the case with multi-chip assemblies.

Further process times and associated costs can be reduced, e.g. during sawing or flip chip bonding because all necessary bump connections of all the filter circuits of the multiplexer can be processed in one step.

The application of the invention is particularly attractive for multiplexers in which only a small number of filter circuits/filter functions are involved, whose frequency has to be met very precisely because of high near-selection requirements, and a larger number of filters with less stringent requirements. Then the critical filters can be essentially trimmed, and the filters can be designed so that there is sufficient margin to meet the less critical specifications.

According to an embodiment, the multiplexer comprises four SAW filter circuits to form a quadplexer. The four filter functions form two duplexers that are configured to allow the quadplexer operating in a band combination of bands B1 and B3, or in a band combination of bands B25 and B66.

In this example, the filter functions for bands B3 and B25 must be trimmed very precisely, while the specifications for bands B1 or B66 are less critical.

However, a more complex selective multiple trimming for individual filter units may also be used.

Initial trimming can be done during stack production. Thereby, the thickness uniformity of deposited or otherwise produced layers is measured and controlled. If necessary, selective thickness reduction is performed by an NF3 beam removing material. Most relevant for the filter specifications are the thicknesses of the dielectric layer and piezoelectric layer.

The invention will be explained in more detail by reference to embodiments and accompanying drawings. The drawings are schematic only and may not be drawn to scale.

Figure 1:
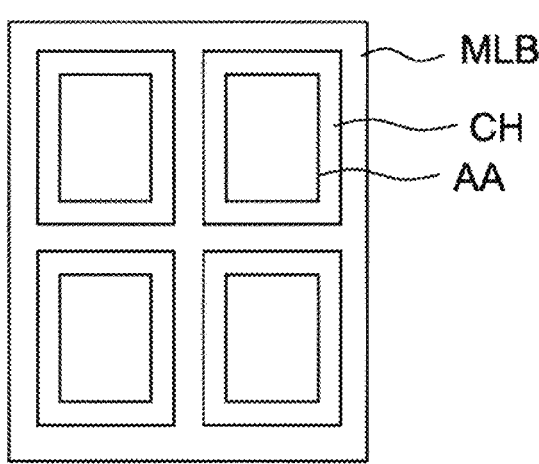
FIG. 1 shows a known multiplexer arrangement of four separate chips on a common multilayer board with necessary chip to chip distances and edge margin.

FIG. 1 shows an arrangement of four separate chips CH on a common multilayer board MLB with necessary chip to chip distances and edge margins. Due to these necessary distances, the acoustically usable area AA of a chip CH is smaller than the area of the chip. Further, the chips must keep a distance to the edge of multilayer board and between neighboring chips.

Figure 2:
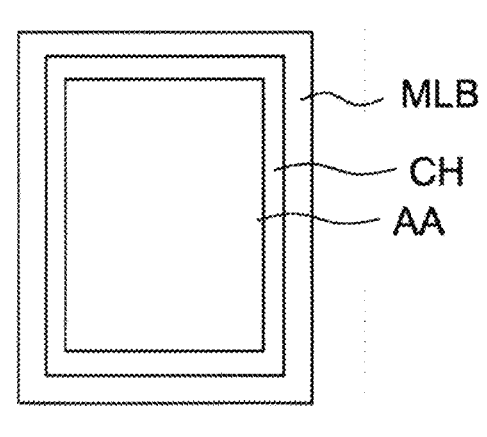
FIG. 2 shows a one-chip multiplexer and the necessary edge margin according to the invention.

FIG. 2 shows in the same scaling the necessary area of a multiplexer realized on a single chip according to the invention. In such an arrangement no chip to chip distance is necessary and the margin of the single chip requires smaller chip area with respect to the arrangement of FIG. 1. The same is true for the margin of the multilayer board MLB. Hence, up to 50% or more of the wafer area may be saved and a multiplexer device can be achieved having a size that is accordingly smaller than that of the known multichip assembly according to FIG. 1.

Figure 3:
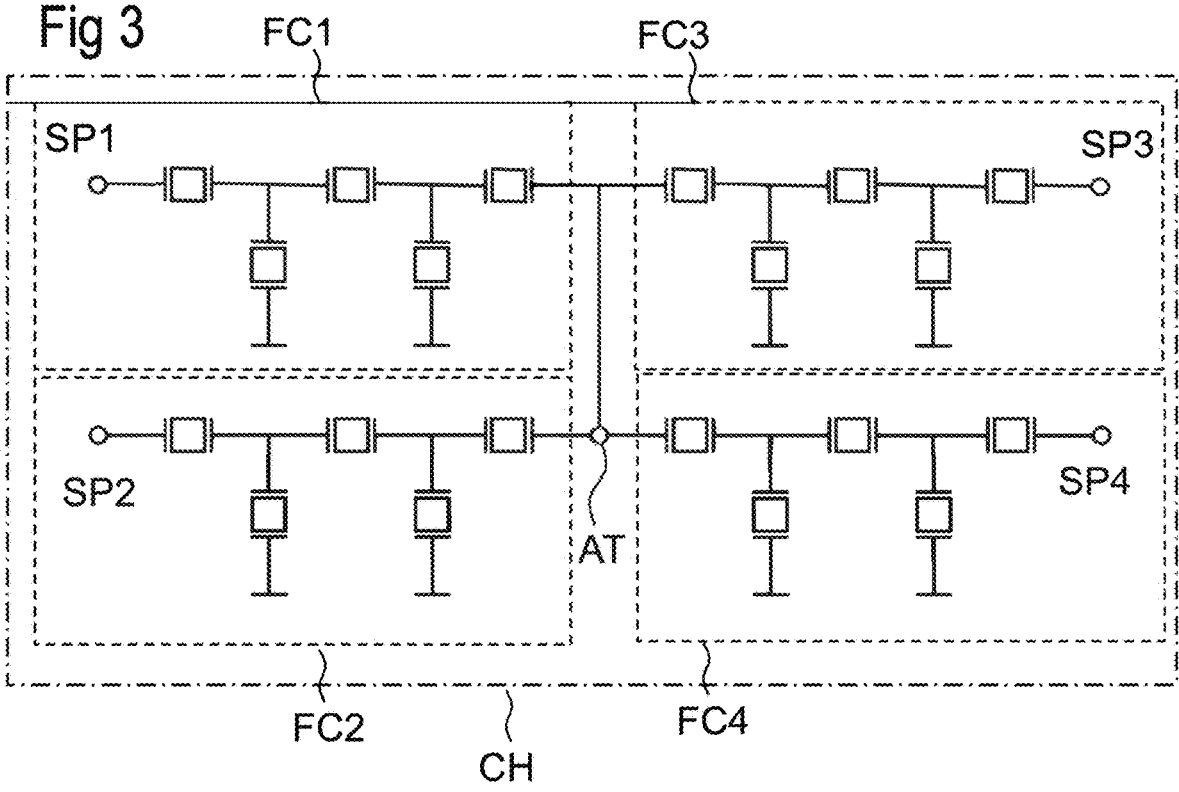
FIG. 3 shows a schematic block diagram of four filter circuits that are arranged on a single chip and connected to a common antenna terminal.

FIG. 3 shows an exemplary schematic block diagram of four filter circuits FC1 to FC4 that are arranged on a single chip CH and connected to a common antenna terminal AT. Each of the filter circuits FC comprises a series signal line SSL connecting each respective signal pad SP to the antenna terminal AT and a number of SAW resonators. Series resonators RS are connected in series and parallel resonators RP are connected in parallel with the series signal line SSL.

The filter circuits are ladder type arrangements and may comprise further elements that are not shown in the figure for clarity reasons. The number of resonators may be higher to achieve a better selectivity. Some of the resonators may be cascaded for improving the power resistance thereof and to improve the life time and to reduce nonlinear behavior. The filter circuit may consist of series resonators RS only. Passive elements may be connected to the resonators or to the series signal line. Capacitors may be circuited in parallel to single resonators to vary the bandwidth thereof. Parallel resonators RP may be connected to ground via an inductance. Some of the ground connections may be combined on the chip. The antenna terminal is connected to ground via a coil for phase shifting and impedance matching. External matching elements may be connected to signal pads or to the series signal line.

Two filter circuits may be assigned to the same first cellular band and form an Rx filter and a respective Tx filter of that band. The other two filter circuits may be assigned to a second cellular band to allow duplex operation in this second band. Preferably the filter circuits are assigned to band combinations having a not too high frequency distance. Preferably the two bands are within the same frequency range selected from high band range and/or mid band range.

Figure 4:
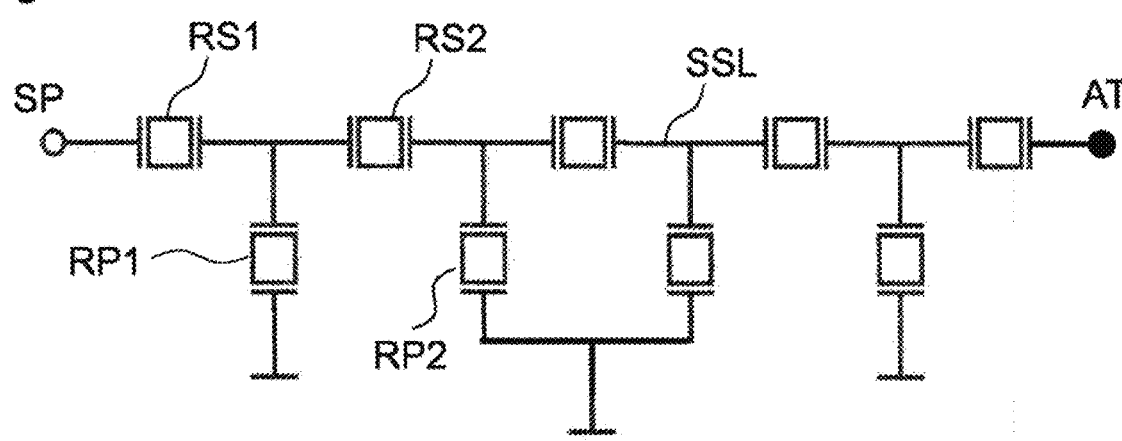
FIG. 4 shows a schematic filter circuit in more detail.

FIG. 4 shows a schematic exemplary filter circuit FC like those depicted in FIG. 3 in more detail. This filter circuit comprises five series resonators RS arranged in the series signal line SSL. Respective nodes between each two neighbored series resonators are connected to ground via a parallel branch and a parallel resonator RP is arranged in every parallel branch. An inductance (not shown) may be circuited between a parallel resonator and ground.

Figure 5:
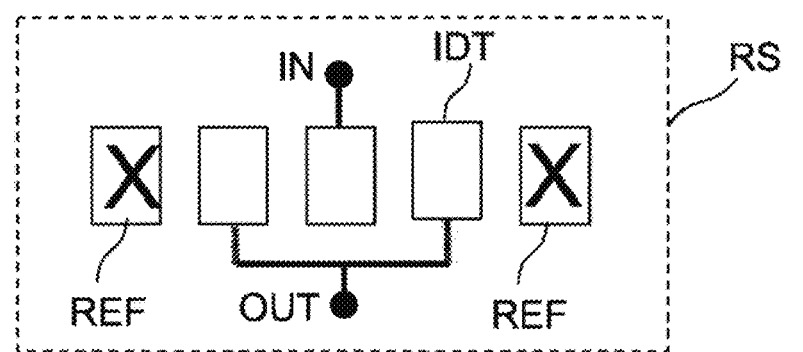
FIG. 5 shows a schematic block diagram of a DMS filter that can be used as a resonator in an Rx filter circuit.

FIG. 5 shows a schematic block diagram of an exemplary DMS filter that can be used as a series resonator in an Rx filter circuit of the multiplexer. A DMS filter comprises a first number of interdigital transducers/resonators IDTs that are connected to the input terminal IN of the DMS filter. A second number of interdigital transducers IDTs are connected to the output terminal OUT of the DMS filter. All IDTs are arranged in an acoustic track extending between two reflectors REF and are hence acoustically coupled. The first and second number may be set higher than depicted according to a required selectivity specification. The bus bars of the IDTs that are not connected to the input or output may be connected to ground or floating. Two DMS filters may be circuited in series within a filter circuit. Other elements of the filter circuit as shown in FIGS. 3 and 4 complete the filter circuit.

Figure 6:
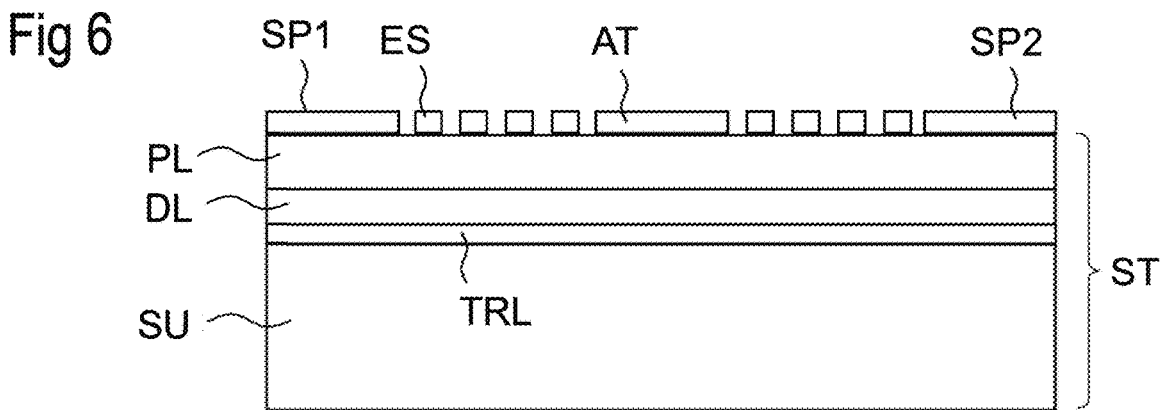
FIG. 6 shows a cross section through a monolithic stack provided with a structured metallization comprising pads, electrode structures and terminals that can be used for the multiplexer.

FIG. 6 shows a schematic cross section through a monolithic stack that is already provided with a structured metallization on top. From the metallization, pads, electrode structures ES like interdigital transducers, reflectors, conductor lines, terminals AT and signal pads SP1, SP2 may be formed as required for forming the multiplexer of FIG. 3 for example.

The carrier substrate SU is a crystalline silicon material of a thickness sufficient to provide required mechanical stability. The stability must be high enough to allow handling of a whole wafer on which the stack ST is formed. The crystalline silicon material of the carrier substrate SU may have a top surface that is a crystallographic surface.

Optionally a trap-rich layer TRL is arranged on top of the carrier substrate SU consisting e.g. of a polycrystalline silicon layer with a thickness in the range of 100 nm to 2000 nm to eliminate e.g. the known free charges at a later Si/SiO2 junction. A dielectric layer DL of SiO2 is formed or deposited to act as a TCF compensating layer. The thickness of the dielectric layer is controlled and set to a value of about 300 nm to 2000 nm, e.g. to 500 nm. All layer junctions can have smooth top and bottom surfaces with small layer roughness.

After smoothing the surface of the dielectric layer DL e.g. by a CMP method a piezoelectric wafer is bonded to the dielectric layer DL. After atomic bonding the thickness of the piezoelectric wafer is reduced to form a thin film piezoelectric layer PL having a thickness of about 400 nm to 2000 nm, e.g. of 600 nm. This is thin enough to allow fast heat dissipation from the filter circuit to the substrate below and to avoid excitement of spurious modes in counter bands or another band that can be operated by the multiplexer. With a sufficiently thin piezoelectric layer spurious modes occur only at frequencies high above the bands used by the multiplexer.

After thickness reduction by an appropriate process, the thickness of the piezoelectric layer is measured and the whole layer is trimmed to achieve a desired thickness all over the whole wafer with only a small tolerance. This is necessary as the frequency of a filter circuit formed on the piezoelectric layer may depend on the specific thickness thereof and a too high tolerance results in a frequency variation and a frequency distribution over the wafer dependent on a remaining thickness variation.

Lithium tantalate LT and lithium niobate LN are preferred piezoelectric materials. But other materials may be used, too.

It is important that the thermal conductivity of substrate SU is at least ten times higher than the respective conductivity of the piezoelectric layer PL. The above proposed silicon substrate SU and piezoelectric layer PL of LT are different in conductivity by a factor of about 40.

The top surface of the stack ST is the main surface on which electrode structures ES and signal pads SP as well as the antenna terminal AT are formed. FIG. 6 shows the metallization in a very schematic depiction. Further pads like ground pads for connecting the parallel branches to ground are present on the main surface but not shown in the schematic figure.

Preferably the electrode structures are formed from a metallization based on Al or an Al alloy. Further, Cu and/or Ti may be further components in the alloy or may be used as a discrete sub-layer of a multilayer metallization. The surface of the metallization may be protected with a passivation layer. The pads are thickened and provided with a solderable surface layer like Au or Ni for example.

To complete the multiplexer, a package is formed on top of the stack ST. For this reason a multilayer board may be bonded to the main surface of the stack.

Figure 7:
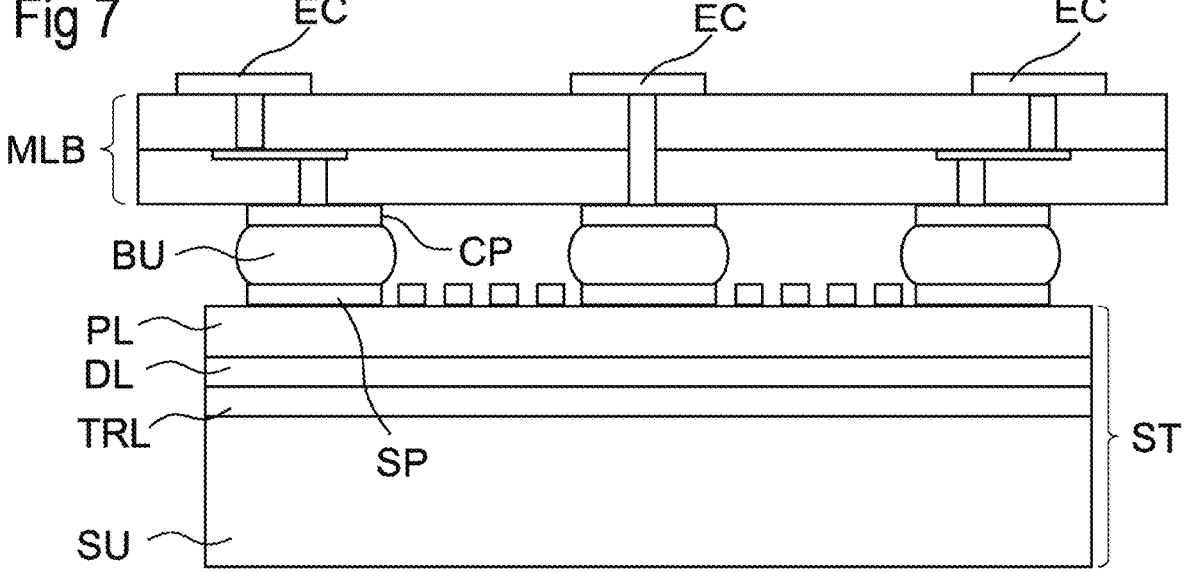
FIG. 7 shows a possible schematic package for the multiplexer.

FIG. 7 shows a cross section of such a multiplexer that is already provided with such a covering board.

The multilayer board MLB may be of any material like an organic laminate like FR4, or form from a ceramic material like LTCC and HTCC. Ceramic is preferred due to its higher thermal conductivity and due to its thermal expansion that is matched to that of the Si carrier. LTCC is the preferred choice for the multilayer board MLB.

Within the multilayer board a wiring is integrated, comprising through-contacts through one or more of the ceramic or laminate layers and wiring planes. The through contacts connect different wiring planes arranged between two such ceramic or laminate layers or a wiring plane with a contact pad CP on the bottom surface or with an external contact EC on the top surface. The wiring serves to interconnect and circuit different signal pads and/or terminals and to provide a connection between the signal pads, the antenna terminal and external contacts EC arranged on top of the multilayer board MLB.

Further, the multilayer board may comprise integrated passives that can be formed from such an integrated wiring. These passives may support the filter functions of the filter circuits. Such integrated passives may be used to form a coil connected to the antenna terminal and inductances in series with parallel branches. Passives that require a higher quality factor like those used to match the terminals of a filter circuit have to be realized as external discrete elements that may be connected to the external contacts.

The mounting of the stack ST to the multilayer board MLB can be done on the wafer level. In a last step single devices can then be separated by dicing the wafer level package e.g. by sawing.

Alternatively a large area multilayer board can be used to mount thereon single stacks that have already been singulated before.

Bumps BU are preferred to connect the multilayer board to the respective pads SP and terminals AT on the main surface of the stack ST. In order to promote heat dissipation from the filter circuit and the respective active piezoelectric layer to the multilayer board a maximum number of bumps is preferred.

In the example of FIG. 3, at least thirteen pads and terminals need to be contacted by a separate bump each. A higher number of parallel branches allows mounting with a higher number of bumps to be performed. Also bumps without any electric functionality might be used to provide better heat dissipation.

In the package, the areas of stack and multilayer board may comply. However, it may be advantageous if a margin of stack or board extends over the edge of the other package layer. Then a sealing layer may be applied from the side of the layer or stack having the smaller area. The sealing layer can then seal the protruding surface in the margin area more easily.

The sealing can be done with a resin, a laminate or a foil; and a hermetic sealing can be achieved with a metal layer as a top sealing layer. The sealing layer needs to be structured to expose at least the external contacts EC of the package.

As the invention has been only described with reference to some embodiments, the invention shall not be limited to any specific embodiment or figure. Features that are specified in more detail in written form or in a figure with reference to an embodiment only shall not be limited to these details as far as the respective feature is disclosed in a more general form and is covered by the claims.

| List of used terms and reference symbols | |
|---|---|
| | cavity |
| | metallization |
| | package |
| | Rx filter |
| | Tx filter |
| AA | acoustically usable area |
| AT | antenna terminal |
| BU | bump |
| CH | chip |
| CP | contact pad |
| DL | dielectric layer |
| EC | external contact |
| ES | electrode structure |
| FC | SAW filter circuit |
| IDT | interdigital transducer |
| IN | input terminal of DMS filter |
| MLB | multilayer board |
| OUT | output terminal of DMS filter |
| PL | piezoelectric layer |
| REF | reflector |
| RS, RP | series and parallel SAW resonators |
| SP | signal pads |
| SSL | series signal line |
| ST | monolithic stack |
| SU | carrier substrate |
| TRL | trap-rich layer |

What is claimed is:

1. An apparatus, comprising:
a layer stack comprising:
   a carrier substrate;
   a piezoelectric layer disposed above the carrier substrate;
   at least one dielectric layer arranged between the piezoelectric layer and the carrier substrate;
   a trap-rich layer arranged between the carrier substrate and the piezoelectric layer, wherein the trap-rich layer comprises polycrystalline silicon; and
   a metallization disposed on or above the piezoelectric layer, comprising:
      an antenna terminal; and
      electrode structures forming at least three surface acoustic wave (SAW) filter circuits connected in parallel between the antenna terminal and a respective signal pad, wherein each SAW filter circuit of the at least three SAW filter circuits comprises a corresponding series signal line and a corresponding plurality of SAW resonators connected in series with or parallel to the corresponding series signal line; and
a package providing a cavity on top of the layer stack formed between the piezoelectric layer and at least one of a lid or a cover, wherein the electrode structures forming the at least three SAW filter circuits are enclosed in the cavity.

2. The apparatus of claim 1, wherein the carrier substrate comprises silicon (Si).

3. The apparatus of claim 1, wherein the at least one dielectric layer is a silicon oxide layer.

4. The apparatus of claim 1, wherein the polycrystalline silicon comprises a thickness between 300 nanometers (nm) to 2000 nm.

5. The apparatus of claim 1, wherein the carrier substrate has a thermal conductivity that is at least ten times larger than a thermal conductivity of the piezoelectric layer.

6. The apparatus of claim 1, further comprising a multilayer board forming at least a portion of the package, a bottom surface of the multilayer board comprising contact pads, wherein the multilayer board comprises an integrated wiring connecting the contact pads with respective external contacts on a top surface opposite to the bottom surface, and wherein the multilayer board is mounted to the layer stack with connections to electrically connect the contact pads with respective signal pads and the antenna terminal.

7. The apparatus of claim 6, wherein the multilayer board is selected from a group consisting of multilayer laminate, HTCC, and LTCC.

8. The apparatus of claim 1, wherein the at least three SAW filter circuits are enclosed in the cavity, and wherein the cavity is integrally formed.

9. The apparatus of claim 1, wherein the at least three SAW filter circuits comprise four SAW filter circuits (FC) that form a quadplexer comprising two duplexers.

10. The apparatus of claim 1, wherein at least one of the at least three SAW filter circuits is a receive (Rx) filter having a DMS filter in the corresponding series signal line.

11. An apparatus, comprising:

a multiplexer comprising at least three surface acoustic wave (SAW) filter circuits each coupled to a common antenna terminal and formed together on a single chip, the single chip comprising:

a carrier substrate;

a piezoelectric layer disposed above the carrier substrate;

at least one dielectric layer arranged between the piezoelectric layer and the carrier substrate;

a trap-rich layer arranged between the carrier substrate and the piezoelectric layer, wherein the trap-rich layer comprises polycrystalline silicon; and a metallization disposed on or above the piezoelectric layer, comprising:

the common antenna terminal; and electrode structures forming the at least three SAW filter circuits, wherein each of the at least three SAW filter circuits is formed from a corresponding plurality of SAW resonators.

12. The apparatus of claim 11, wherein two of the at least three SAW filter circuits are configured to form a duplexer.

13. The apparatus of claim 11, wherein two of the at least three SAW filter circuits are configured to form a duplexer with a first SAW filter circuit of the at least three SAW filter circuits configured for a receive frequency of a band and a second SAW filter circuit of the at least three SAW filter circuits configured for a transmit frequency of the band.

14. The apparatus of claim 11, wherein the at least three SAW filter circuits comprise four SAW filter circuits configured to form a quadplexer.

15. The apparatus of claim 14, wherein the quadplexer includes a first duplexer associated with a first band and a second duplexer associated with a second band.

16. The apparatus of claim 11, wherein the at least three SAW filter circuits are enclosed in a cavity integrally formed as a thin film acoustic package.

17. The apparatus of claim 11, wherein the multiplexer further comprises a package providing a cavity enclosing the at least three SAW filter circuits and formed between the piezoelectric layer and a lid or a cover.

\* \* \* \* \*